United States Patent [19]

Hawrylo

[11] 4,394,679
[45] Jul. 19, 1983

[54] LIGHT EMITTING DEVICE WITH A CONTINUOUS LAYER OF COPPER COVERING THE ENTIRE HEADER

[75] Inventor: Frank Z. Hawrylo, Trenton, N.J.

[73] Assignee: RCA Corporation, New York, N.Y.

[21] Appl. No.: 187,160

[22] Filed: Sep. 15, 1980

[51] Int. Cl.³ ............... H01L 23/12; H01L 23/36
[52] U.S. Cl. ............................ 357/81; 357/74; 357/17; 357/71
[58] Field of Search ............... 357/74, 81, 17, 91

[56] References Cited

U.S. PATENT DOCUMENTS

| | | | |
|---|---|---|---|
| 3,258,662 | 6/1966 | Fleming, Jr. | 357/81 |
| 3,417,458 | 12/1968 | Lob et al. | 357/81 |
| 3,733,691 | 5/1973 | Mann | 29/588 |
| 3,743,895 | 8/1973 | Klunker et al. | 357/81 |
| 3,869,702 | 3/1975 | Backhouse et al. | 357/74 |
| 3,946,416 | 3/1976 | Hacskaylo | 357/81 |
| 3,950,142 | 4/1976 | Brenan et al. | 357/81 |
| 4,057,825 | 11/1977 | Narita et al. | 357/81 |

Primary Examiner—Andrew J. James
Assistant Examiner—E. D. Burnside
Attorney, Agent, or Firm—Birgit E. Morris

[57] ABSTRACT

The invention is an improved light emitting device comprising a light emitting element mounted on a header wherein the improvement comprises a thin layer of copper overlying the surface of the header including both the base and the stud. A large increase in the yield of useable devices is obtained for a light emitting element mounted on the header which emits between about 1.0 and about 1.7 micrometers.

6 Claims, 1 Drawing Figure

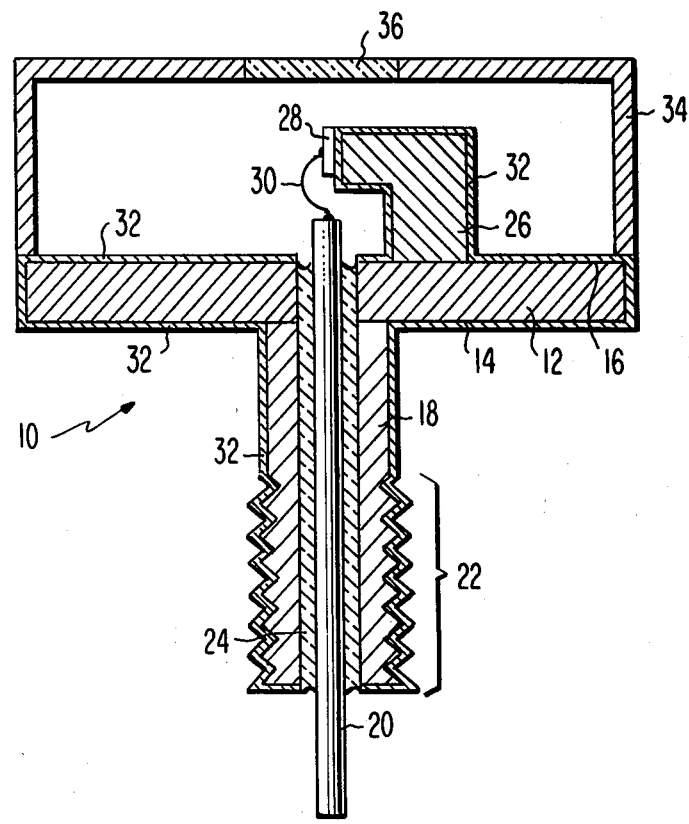

LIGHT EMITTING DEVICE WITH A CONTINUOUS LAYER OF COPPER COVERING THE ENTIRE HEADER

The Government has rights in this invention pursuant to Contract No. F19628-79-C-0115 awarded by the Department of the Air Force.

The invention relates to an improved light emitting device and, in particular, to a light emitting device comprising a light emitting element mounted on a header which is coated with a thin layer of copper.

BACKGROUND OF THE INVENTION

A light emitting element such as a semiconductor light emitting diode or injection laser diode is typically mounted on a header such as that disclosed by Backhouse et al in U.S. Pat. No. 3,869,702 issued Mar. 4, 1975. The header is comprised of a steel base plate with a steel stud mounted on a major surface of the plate. The stud is typically threaded so that the device can be mounted on a cooler or other support. The light emitting element is mounted on a second major surface of the base plate or on a copper block which is mounted on the steel base plate.

A light emitting element composed of GaAs and AlGaAs mounted on this header performs well in continuous wave operation with a high yield of useful devices. However, for a light emitting element composed of InP and a quaternary compound such as InGaAsP the yield of useable devices in continuous wave operation is quite low. The reason for this difference is not understood but may be related to a need for better thermal dissipation for diodes containing quarternary compounds.

SUMMARY OF THE INVENTION

A light emitting device comprises a header with a thin layer of copper overlying the surface of the header, including both the base and the stud, with a light emitting device mounted thereon. The improved light emitting device provides a large increase in the yield of devices which can operate in a continuous wave mode.

BRIEF DESCRIPTION OF THE DRAWING

The FIGURE shows a schematic illustration of a cross sectional view of the improved light emitting device of the invention.

DETAILED DESCRIPTION OF THE INVENTION

Referring to the FIGURE, the improved light emitting device 10 is comprised of a base plate 12 having major surfaces 14 and 16 with a mounting stud 18 mounted on the major surface 14 of the base plate 12. The mounting stud 18 has an electrical lead 20 extending axially therethrough and through an opening in the base plate 12 and a threaded portion 22 suitable for mounting on an external support. The electrical lead 20 is isolated from the mounting stud 18 by an electrically insulating material 24 such as a glass or plastic encapsulant. A copper mounting block 26 is mounted on the major surface 16 of the base plate 12 and a light emitting element 28 is mounted on the copper block 26. An electrical wire 30 connects the electrical lead 20 to one side of the light emitting element 28 with the second electrical contact to the light emitting element 28 being made through the base plate 12 and the stud 18. A thin layer 32 of copper overlies the surfaces of the base plate 12 and the outer surface of the mounting stud 18 including the threaded portion 22. A cover 34 with a light transmissive window 36 mounted therein is attached to the major surface 16 of the base plate 12 and encloses the light emitting element 28. The window 36 is so positioned in the cover 34 that a light beam emitted by the element 28 will pass through the window 36.

Electrical current flowing through the light emitting element 28 generates light by the recombination of charge carriers in the vicinity of the p-n junction of the light emitting element. The light passes out of the light emitting device 10 through the window 36 in the cover 34. Heat generated in the element 28 is dissipated by conductive flow into the copper block 26 and then through the base plate 12 and the stud 18 into the support in which the stud is mounted.

For an element composed of Group III-V materials and emitting light between about 1.0 micrometer and about 1.7 micrometers, such as a conventional InP-InGaAsP light emitting diode, the yield of devices which will operate in a continuous wave mode when mounted on this header is small, being about 10 percent. I have found that coating the header, including the base plate, the stud and the copper block, if present, with a thin layer of copper between about 5 micrometers and about 125 micrometers thick and, preferably between about 5 and about 50 micrometers thick, improves the yield of useable devices from about 10 percent to about 75 percent. The improvement in yield begins at a thickness of about 5 micrometers and increases rapidly up to about 50 micrometers and more slowly beyond about 50 micrometers. This greater than an order of magnitude increase in yield is surprising since a header with an added copper layer in this thickness range should increase the heat conduction from the light emitting element to the support in which the header is mounted by less than a factor of two. This result occurs even where the element is one mounted on a copper block on the header.

The improved light emitting device of the invention is fabricated by mounting the stud to the base plate, both of which are composed of cold rolled steel. The header thus formed is then coated with a layer of copper between about 5 micrometers and about 125 micrometers, and preferably between about 5 and about 50 micrometers thick, by a process such as electrolytic deposition. The use of a layer thicker than about 125 micrometers is undesireable since a rough, non-uniform coating results. It has been found to be useful to coat the header with a layer of nickel between about 0.1 and about 1.0 micrometers thick prior to the coating with copper to improve the adhesion of the copper layer to the header. After deposition of the copper layer the header is coated with a layer of nickel between about 0.1 and about 1.0 micrometers thick, preferably by electrolytic deposition, and, preferably, a layer of gold between about 0.1 and about 1.0 micrometers thick. If a copper block is mounted on the base plate, the copper layer is also deposited on the surface of the copper block, thereby forming a continuous layer over the entire surface of the header prior to the nickel coating.

After the header and copper block, if present, have been coated with the copper and nickel layers, the light emitting element is mounted on the header by soldering it to the copper block or base plate. The element is connected to the base plate 12 by the solder joint and to the electrical lead 20 by the wire 30. The cover 34 having a window 36 mounted therein may be fastened by soldering or welding to the base plate 12 to enclose the light element 28.

I claim:

1. In a light emitting device which comprises:
a base plate having two major surfaces;
a stud axially mounted on a first major surface;
a copper block mounted on the second major surface of the base plate; and
a light emitting element mounted on the copper block;
the improvement which comprises:
a continuous layer of copper between about 5 and about 125 micrometers thick covering the base, the copper block and the stud.

2. A light emitting device according to claim 1 wherein the copper layer is between about 5 and about 50 micrometers thick.

3. A light emitting device according to claim 1 wherein the light emitting element is composed of group III-V materials which emit light having a wavelength between about 1.0 micrometer and about 1.7 micrometers.

4. A light emitting device according to claim 1 further comprising a cover having a window mounted therein mounted on the base plate which encloses the light emitting element;
wherein the window is so positioned in the cover that a light beam emitted by the element passes through the window.

5. In a header which comprises:
a base plate having two major surfaces;
a stud axially mounted to a first major surface;
and a copper block mounted on the second major surface;
the improvement which comprises:
a continuous layer of copper between about 5 and about 125 micrometers thick covering the entire header.

6. A header according to claim 1 wherein the copper layer is between about 5 and about 50 micrometers thick.

* * * * *

UNITED STATES PATENT AND TRADEMARK OFFICE
CERTIFICATE OF CORRECTION

PATENT NO. : 4,394,679
DATED : July 19, 1983
INVENTOR(S) : Frank Zugmunt Hawrylo It is certified that error appears in the above-identified patent and that said Letters Patent is hereby corrected as shown below:

Claim 6, line 1, "according to claim 1" should read --according to claim 5--.

Signed and Sealed this

Fifteenth Day of November 1983

[SEAL]

Attest:

GERALD J. MOSSINGHOFF

Attesting Officer

Commissioner of Patents and Trademarks